United States Patent
Zhang et al.

(10) Patent No.: US 10,069,508 B1
(45) Date of Patent: Sep. 4, 2018

(54) MULTIPLEXER CIRCUIT FOR A DIGITAL TO ANALOG CONVERTER

(71) Applicant: Avago Technologies General IP (Singapore) Pte. Ltd., Singapore (SG)

(72) Inventors: Jiawen Zhang, Irvine, CA (US); Adesh Garg, Irvine, CA (US); Ali Nazemi, Irvine, CA (US); Jun Cao, Irvine, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 15/684,737

(22) Filed: Aug. 23, 2017

(51) Int. Cl.
| | |
|---|---|
| *H03M 1/62* | (2006.01) |
| *H04J 3/06* | (2006.01) |
| *H04L 7/00* | (2006.01) |
| *H03M 1/66* | (2006.01) |
| *H03M 1/08* | (2006.01) |
| *H03M 1/06* | (2006.01) |
| *H03M 1/10* | (2006.01) |

(52) U.S. Cl.
CPC ......... *H03M 1/662* (2013.01); *H04J 3/0617* (2013.01); *H04L 7/0091* (2013.01); *H03M 1/0624* (2013.01); *H03M 1/0836* (2013.01); *H03M 1/10* (2013.01); *H03M 1/1057* (2013.01); *H03M 1/66* (2013.01)

(58) Field of Classification Search
CPC .... H03M 1/0624; H03M 1/0836; H03M 1/10; H03M 1/1057; H03M 1/66; H03M 1/662
See application file for complete search history.

(56) References Cited

U.S. PATENT DOCUMENTS

| 7,006,021 B1* | 2/2006 | Lombaard | H03M 9/00 341/100 |
|---|---|---|---|
| 7,372,386 B1* | 5/2008 | Maloberti | H03M 1/0626 341/137 |
| 7,928,770 B1* | 4/2011 | Bellis | G11C 7/1051 326/38 |
| 9,685,969 B1* | 6/2017 | Garg | H03M 1/10 |
| 9,716,508 B1* | 7/2017 | Zhang | H03M 1/0678 |
| 2002/0105386 A1* | 8/2002 | Shastri | H03L 7/07 331/11 |
| 2004/0086002 A1* | 5/2004 | Daily | H04J 3/047 370/539 |
| 2013/0063293 A1* | 3/2013 | Zhang | H03M 7/3002 341/143 |

* cited by examiner

*Primary Examiner* — Ross E Varndell
(74) *Attorney, Agent, or Firm* — Oblon, McClelland, Maier & Neustadt, L.L.P.

(57) ABSTRACT

Multiplexing circuitry and method for driving multiplexing circuits are provided. A circuit includes a multiplexer circuit having symmetrical data input paths driven by a half-rate clock signal and a first stage multiplexing circuit configured to provide input signals to the multiplexer circuit. The first stage multiplexing circuit is driven by quadrature clocks to generate time-shifted data.

20 Claims, 7 Drawing Sheets

MULTIPLEXER CIRCUIT FOR A DIGITAL TO ANALOG CONVERTER

FIELD OF DISCLOSURE

The present disclosure relates generally to a multiplexer circuit that may be used, for example, in a digital to analog converter based transmitter.

BACKGROUND

Digital to analog converter (DAC)-based transmitters continue to demand higher speeds and high resolution for data transfer. Conventional half-rate multiplexers for digital to analog converter based transmitters suffer from undesirable tone close to the frequency of signal modulated by half of the sampling frequency (Fs/2±Fout) that limit a spurious-free dynamic range (SFDR) and an effective number of bits (SNOB) of the DAC. Further, the data quality may be degraded at high sampling frequencies.

The foregoing "Background" description is for the purpose of generally presenting the context of the disclosure. Work of the inventors, to the extent it is described in this background section, as well as aspects of the description which may not otherwise qualify as prior art at the time of filing, are neither expressly or impliedly admitted as prior art against the present invention.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Referring now to the drawings, wherein like reference numerals designate identical or corresponding parts throughout several views, the following description relates to multiplexing circuits for use in digital to analog converter based transmitters.

Digital to analog converter (DAC) based transmitters are commonly used in communication systems. To process a signal at high speed, a signal input to a DAC may be divided into multiple signals and thereby received through a multiplexer. The multiplexer is generally abbreviated to MUX. Multiplexing digital to analog converter based transmitters may be referred to as MUX-DAC transmitters. The multiplexer is a circuit that functions to select one input data signal from a plurality of input data signals and output the selected data signal. A data signal to be selected is determined by an input state of a selection signal.

An aspect of the present disclosure includes a circuit including a multiplexer circuit having symmetrical data input paths driven by a half-rate clock signal; and a first stage multiplexing circuit configured to provide input signals to the multiplexer circuit. The first stage multiplexing circuit is driven by quadrature clocks to generate time-shifted data.

In a further aspect of the present disclosure, there is provided a circuit. The circuit includes a clock synchronizer. The clock synchronizer is configured to synchronize a half-rate clock signal. The clock synchronizer is driven by a full-rate clock signal.

In a further aspect of the present disclosure, there is provided a method for driving multiplexer circuits for a transmitter. The method includes inputting a half-rate clock signal to the flip-flops, clocking the flip-flops with full-rate clock signals to synchronize the output half-rate clock signal, and driving one or more multiplexer circuits with the synchronized half-rate clock signals. Each of the one or more multiplexer circuits has symmetrical data input paths.

Figure 1:
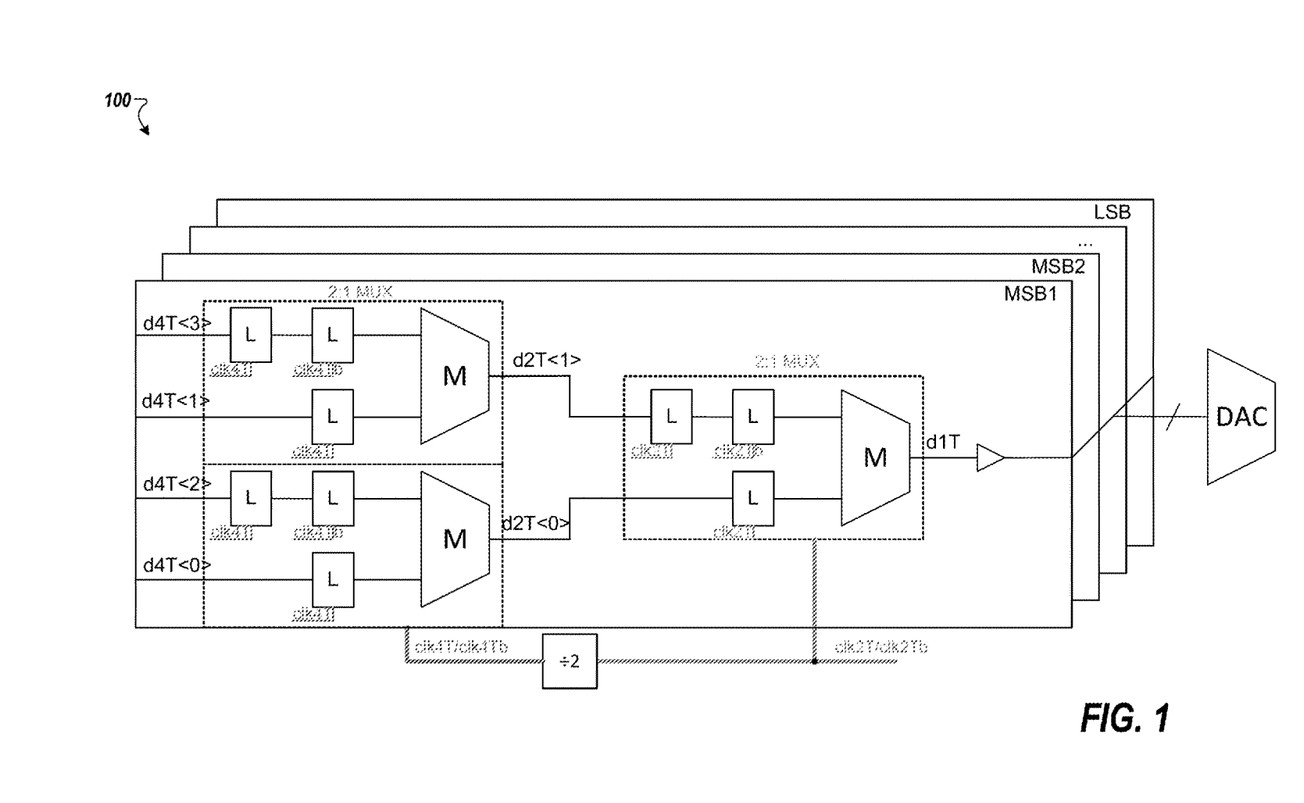
FIG. 1 is a schematic that shows a half-rate multiplexer architecture.
Figure 2:
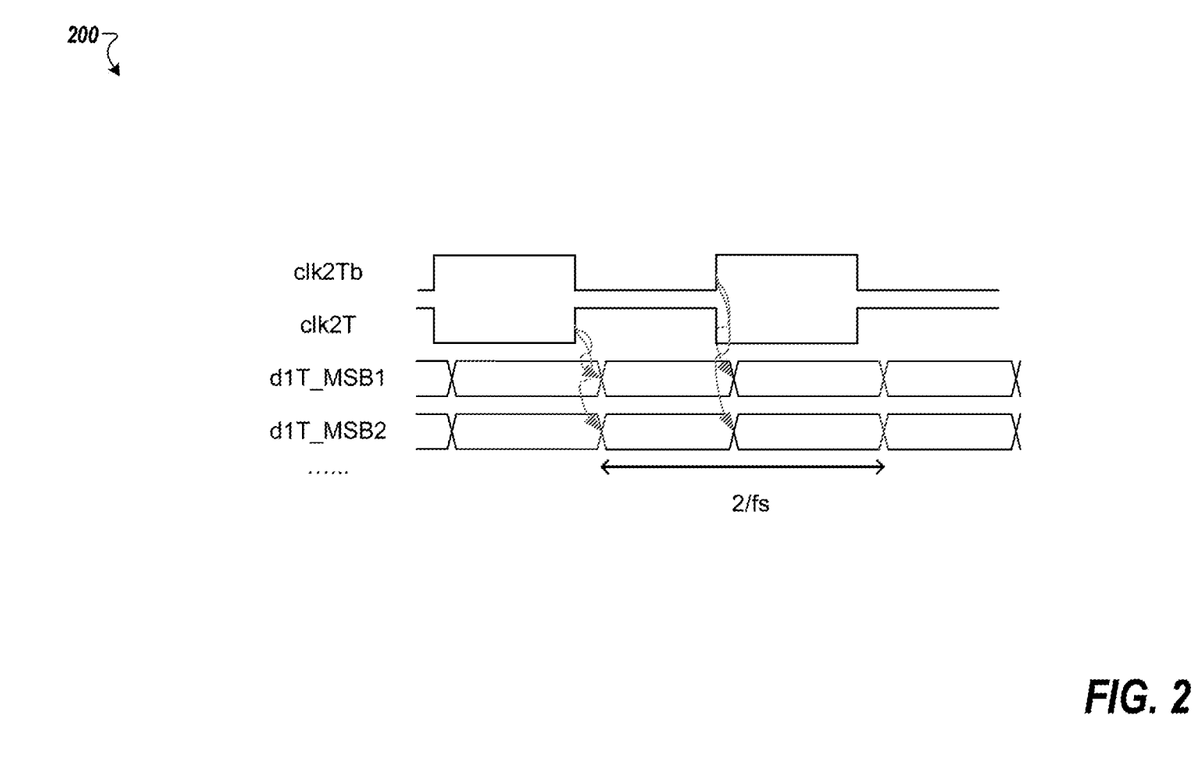
FIG. 2 is a schematic that shows a data duty cycle according to one example.

FIG. 1 is a schematic that shows a conventional half-rate multiplexer architecture 100. The half rate multiplexer architecture includes unbalanced 2:1 multiplexers. The layout mismatch of the half-rate multiplexer and the unbalanced 2:1 multiplexers can cause a duty cycle error in output data d1T. The duty cycle error may be due to a mismatch between a clock signal to output data delay and a complement clock signal to output data delay. An exemplary timing diagram 200 of the duty cycle error is shown in FIG. 2. The mismatch contributes to an undesirable tone (Fs/2±Fout) on the spectrum which in turn limits spurious-free dynamic range (SFDR) and effective number of bits (ENOB) of the DAC. Fs represents the sampling frequency. Fout represents the output frequency. The half-rate clocks also contribute to the Fs/2±Fout tone. The duty cycle error of clock directly translates to data duty cycle error, hence the Fs/2±Fout tone on the DAC output. In FIG. 2, a clock signal is indicated by clk2T and the complement clock signal is indicated by clk2Tb. Schematic 200 shows the effect of the mismatch between the delay of clk2T and clk2Tb on multiplexer associated with consecutive bits.

Note in the Figures that the "b" at the end of a signal label indicates that the signal is the complement (i.e., inverted) of a corresponding like-labeled signal.

Figure 3:
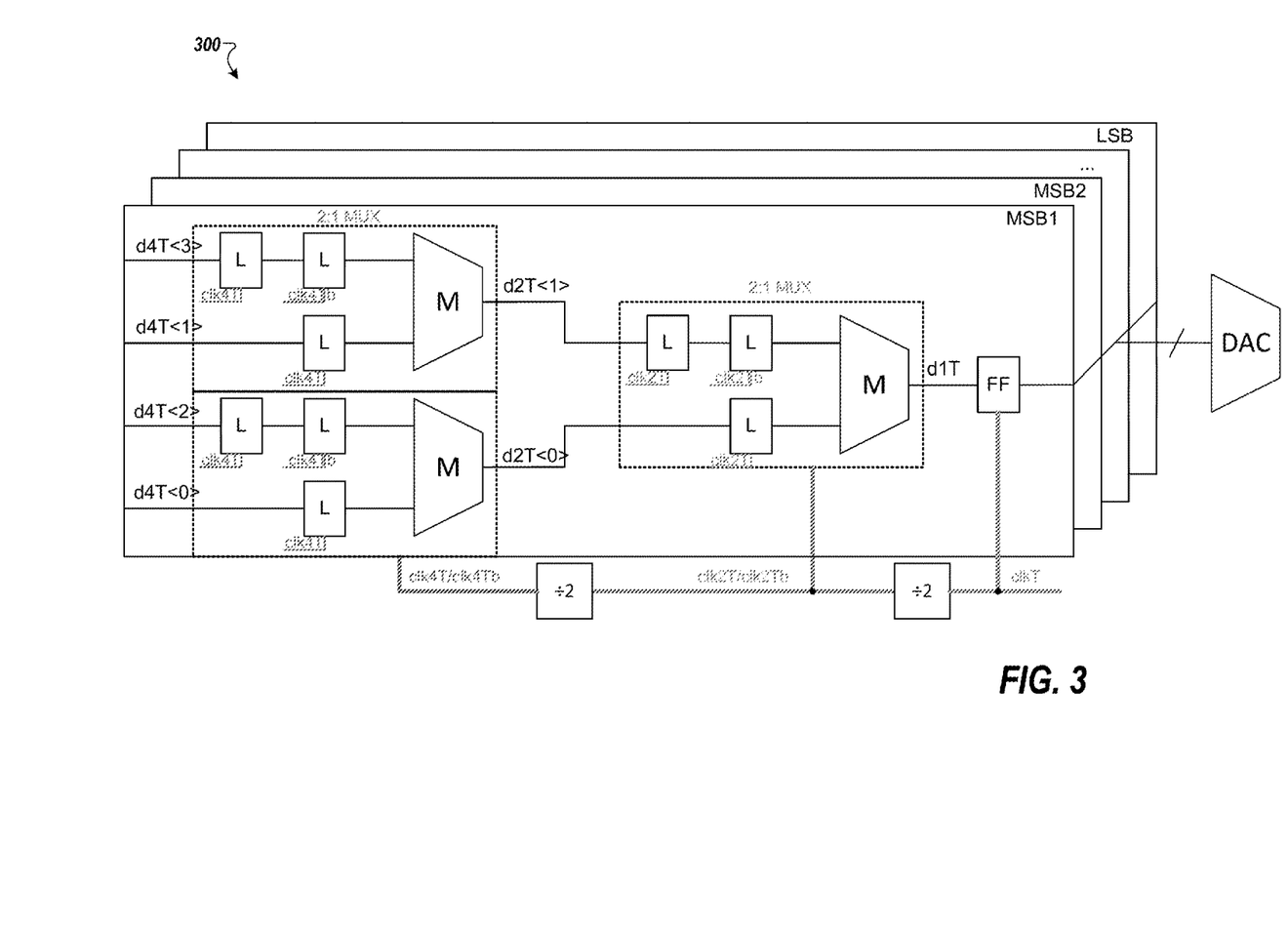
FIG. 3 is a schematic that shows a full-rate multiplexer architecture according to one embodiment.

FIG. 3 is a schematic that shows a full-rate multiplexer architecture 300 according to one example. The full-rate multiplexer architecture 300 can minimize the duty cycle error in the output data d1T by using a flip flop in a data path thus improving the SFDR and the ENOB of the DAC. However, the flip-flop introduces a full-rate interface which prevents the transmitter to run at very high speed. In addition, at high frequency, the flip-flop may generate more intersymbol interference (ISI) than complementary metal oxide semiconductor (CMOS) inverters (e.g., such as used in a half-rate multiplexer architecture 100 of FIG. 1) due to lack of settling time. The ISI can cause non-linearity in the DAC and can degrade overall performance.

Figure 4:
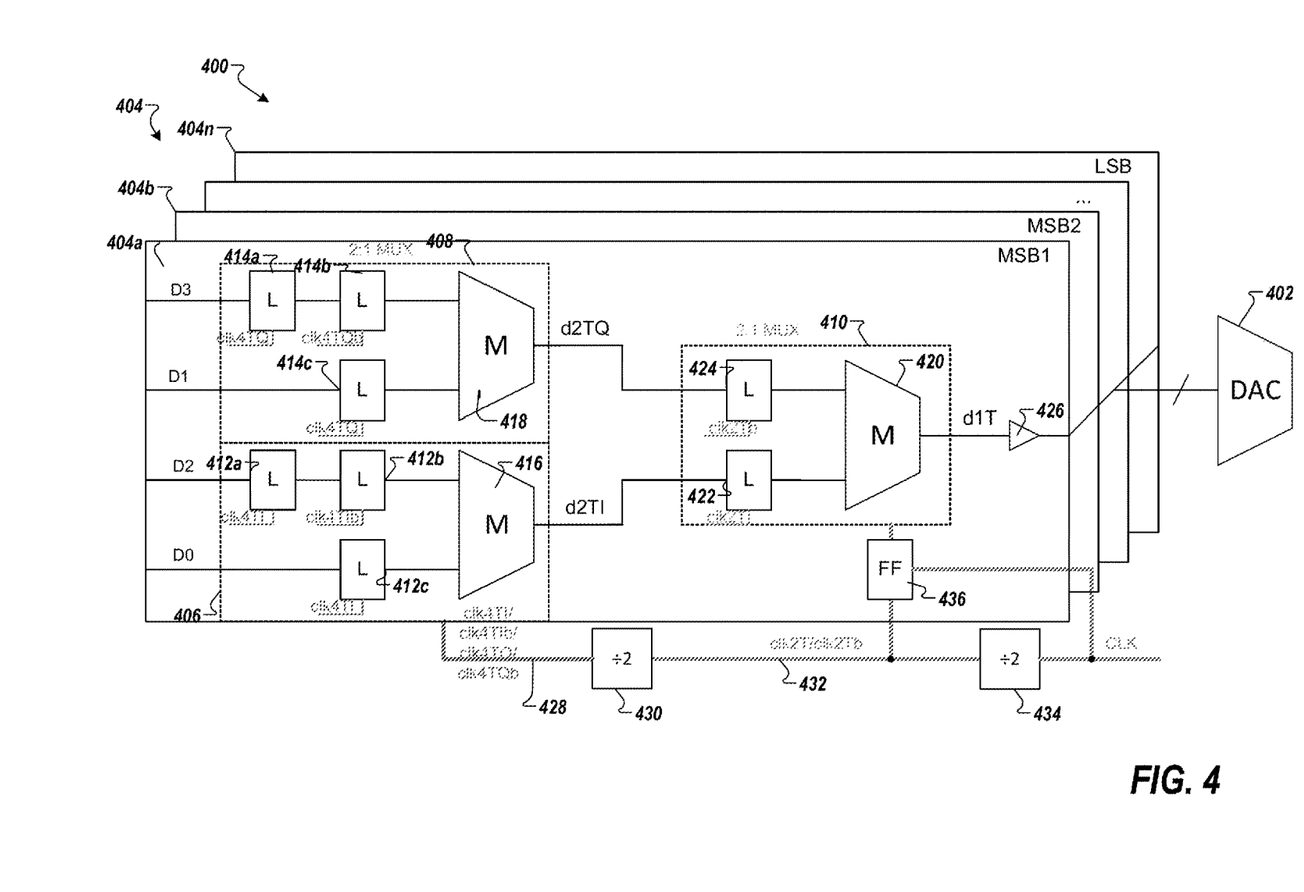
FIG. 4 is a schematic that shows a full-rate multiplexer circuit according to one embodiment.

FIG. 4 is a schematic that shows a full-rate multiplexer circuit 400 according to one example. The circuit 400 includes multiple multiplexing circuits 404 (i.e., 404a, 404b, . . . , 404n) associated with each bit of the data (i.e., most significant bit (MSB1), MSB2, . . . , least significant bit (LSB), assuming thermometer-coded to some degree). Each multiplexer circuit 404 may include suitable logic, circuitry, and/or code that may be adapted to receive a plurality of digital signals (values) and selects an input digital signal to transfer to an output of the multiplexer. The circuit 400 includes a digital to analog converter (DAC) 402 coupled to the multiplexer circuits to convert a digital signal into an analog signal.

The multiplexer circuit 404 can include a first stage and a second stage that reduce the data input to a single output by alternately selecting between two inputs and stream them into the single output. The first stage allows a four to two multiplex function to take place in which the four inputs (e.g., D0, D1 D2, and D3) are reduced to two d2TQ, d2TI. The second stage allows a two to one multiplex function in which the output of the first stage is reduced to one.

The first stage can include a first 2:1 MUX circuit 406 and a second 2:1 MUX circuit 408. The first stage outputs to the second stage. The first stage is provided with four data lines as input. Two data lines to the first 2:1 MUX circuit 406 and two data lines to the second 2:1 MUX circuit 408.

In other implementations, the multiplexer circuit 404 may include more than two stages. For example, a first stage may be provided with eight data lines, followed by an intermediate stage, and a final stage. The first stage may provide an eight to four multiplex function. The intermediate stage may provide a four to two multiplex function. The final stage may provide a two to one multiplex function.

The first stage 2:1 MUX, representing a 4:2 multiplexer level, includes a first MUX circuit 406 and a second MUX circuit 408. The first 2:1 MUX circuit 406 includes a first multiplexer 416. The first 2:1 MUX circuit 406 can also include latches (e.g., data reamers) 412a, 412b, 412c. Latch 412a is coupled to the input data bit D2. Input data bit D2 also passes through latch 412b. Latch 412c is coupled to input data bit D0. The input data bit D2 passes through one more latch than the input data bit D0 does, thus D0 is output earlier than D2. The latches 412 ensure the data is properly aligned in time to an output clock signal. The first multiplexer 416 selects one of input data bit D2 and D0 latched in 412b and 412c. The clock signal for the first 2:1 MUX circuit 406 is discussed further below. The second 2:1 MUX circuit 408 includes a second multiplexer 418. The second 2:1 MUX circuit 408 can include latches 414a and 414b for sequentially latching input data bit D3 and latch 414c for latching input data bit D1. The second multiplexer 418 selects one of input data bit D3 and D1 latched in 414b and 414c, respectively and outputs the selected data bit as d2TQ. The clock signal for the second 2:1 MUX circuit 408 is discussed further below. The first 2:1 MUX circuit 406 and the second 2:1 MUX circuit 408 may be similar.

The second stage 2:1 MUX circuit 410 can include a multiplexer 420 and latches 422 and 424. A first data output d2TQ from the first 2:1 multiplexer circuit 406 is coupled to latch 422. A second data output d2TI from the second 2:1 multiplexer circuit 408 is coupled to latch 424. The data output are fed to the multiplexer 420 that selects one of the first and the second output data bits d2TQ and d2TI latched in each of the first latch 422 and the second latch 424 and outputs the selected data bit d1T in FIG. 4. The output data bit d1T from the second stage 2:1 MUX circuit 410 is fed to an inverter 426.

Data signal in the second stage 2:1 MUX circuit 410 passes through the same number of latches (i.e., each of d2TQ and d2TI data passes through a single latch). The fully symmetrical design of the second stage reduces the systematic duty cycle error on the full-rate data (i.e., d1T) and hence improves the SFDR and ENOB of the DAC.

Figure 5:
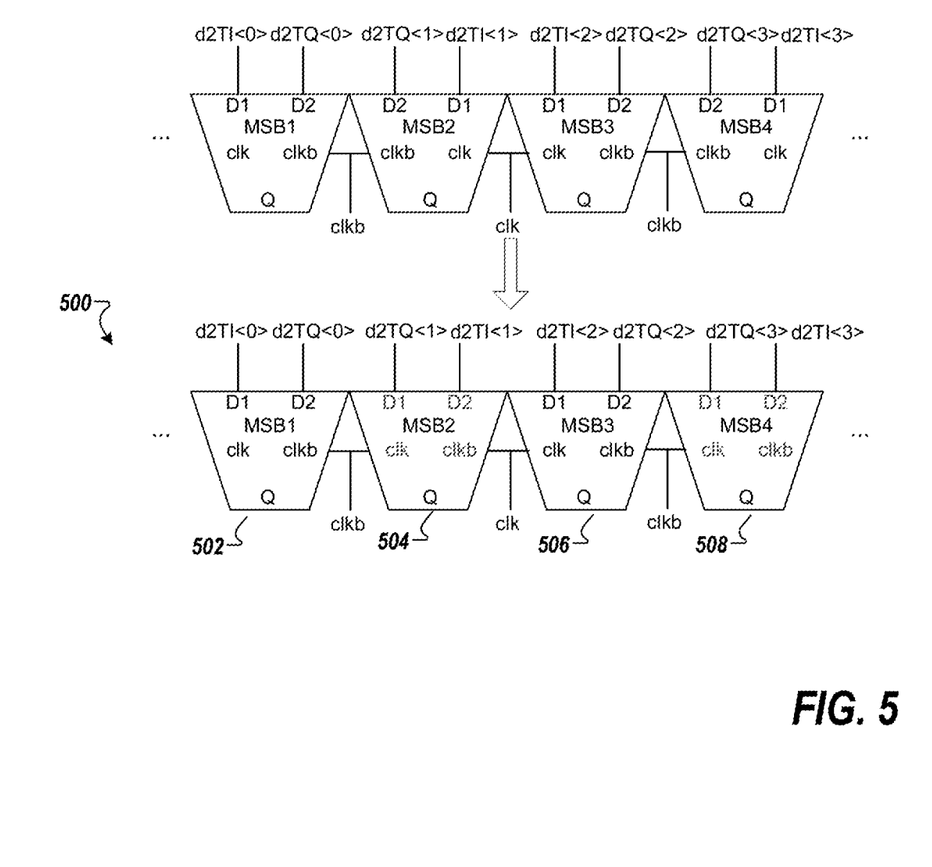
FIG. 5 is a schematic that shows a configuration of 2:1 multiplexer of each bit according to one embodiment.

FIG. 5 is a schematic that shows a layout placement 500 for the 2:1 multiplexers of each bit of data according to one example. Due to the symmetrical design in the second stage, data duty cycle distortion due to layout-induced mismatch is minimized by implementing the layout placement described herein. A single clock signal may be used at input CLK and at input CLKb of two multiplexers in the second stage of two multiplexing circuit corresponding to consecutive bits, simultaneously. Similarly, a complemented clock signal CLKb may be used at input CLK and CLKb of the multiplexers simultaneously. For example, multiplexers 502, 504, 506, and 508 may be arranged in a fashion such as a first complement clock signal may be used at input CLKb of multiplexer 502 and at input CLK of multiplexer 504. A first clock signal CLK is used at input CLKb of multiplexer 504 and at input CLK of multiplexer 506. A second complement clock signal is used at input CLKb of multiplexer 506 and at input CLK of multiplexer 508. The multiplexers 502, 504, 506 and 508 may be associated with the multiplexing circuits for the MSB1, MSB2, MSB3, and MSB4 data bits, respectively. D2TQ is input at D1 of multiplexer 504 and d2TI is input at D2 of multiplexer 504. D2TI is input at D1 of multiplexer 502 and D2TQ is input at D2 of multiplexer 502. Thus, there is a data swap for every other multiplexer. In FIG. 5, four multiplexers are shown but it is to be understood that the number of multiplexers corresponds to the number of multiplexing circuits which corresponds to the number of data bits. In one implementation, the clock signals for the multiplexer may be obtained from trunk 432 of FIG. 4 or via the flip flop 436.

Figure 6:
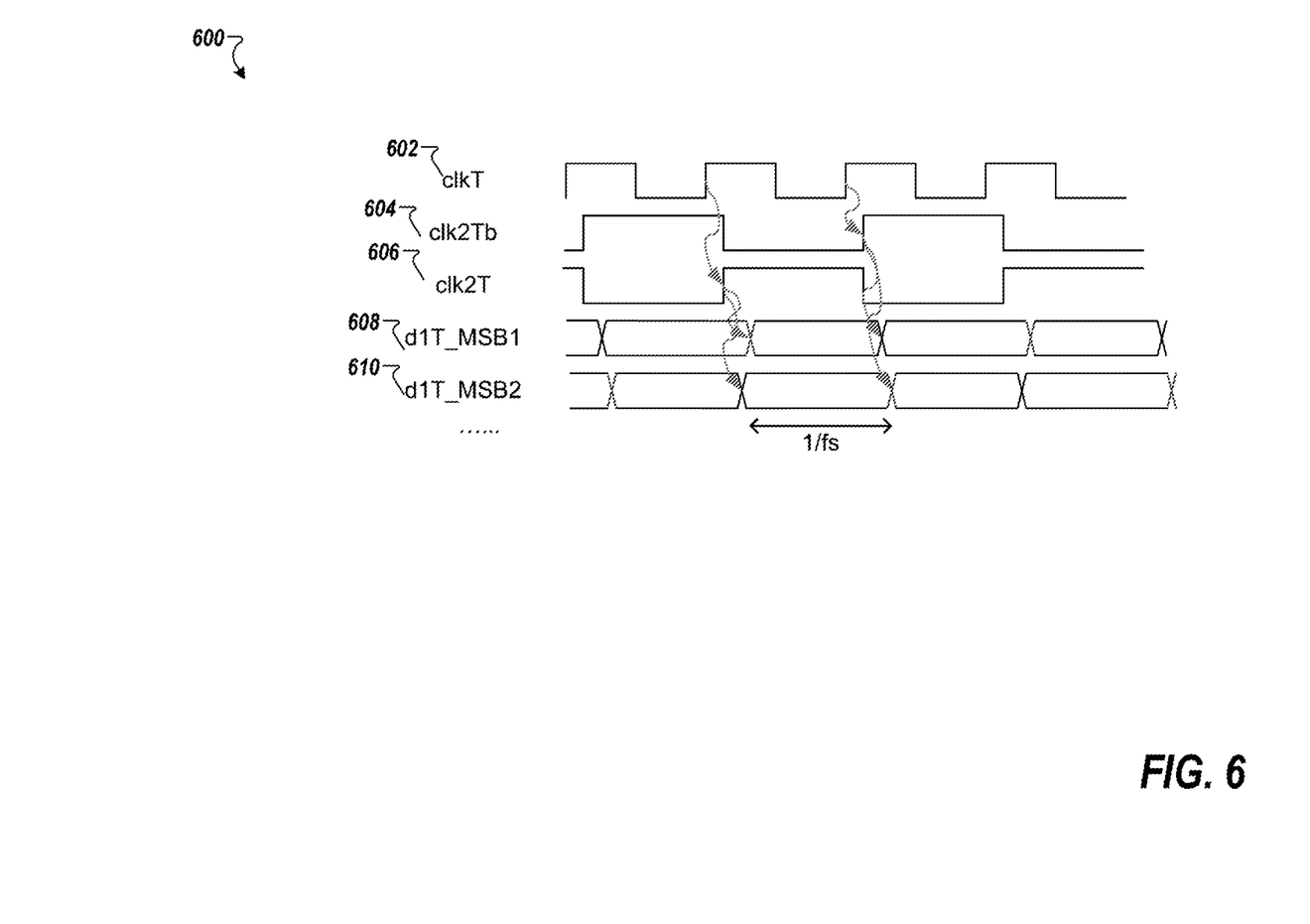
FIG. 6 is a schematic that shows a timing diagram of various signals in the circuit.

By implementing the layout placement 500 described herein, the mismatch between CLK to output data Q and CLKb to output data Q delay is mixed together, affectively shifting the corresponding tone from Fs/2±Fout to Fs±Fout, which in turn dramatically reduce the layout mismatch effect as shown in FIG. 6.

In one implementation, the layout placement 500 may be implemented in a half rate multiplexer architecture such as shown in FIG. 1 to improve data performance by shifting the undesirable tone on the DAC output.

The circuit 400 can include a clock generator (not shown) for providing a clock signal CLK. In some implementations, the clock generator may be an external component that provides clock signals to one or more multiplexing circuits (i.e., 404a-404n).

The clock signal is first passed through a first clock divider circuit 434. The first clock divider circuit 434 is configured to receive the clock signal CLK and produce an output clock signal of a lower frequency. For example, a 1 GHz clock is reduced to a 0.5 GHz clock (i.e., have a ratio of 2). Further, the clock signal from trunk 432 is passed through a second clock divider circuit 430 to obtain a clock signal of a lower frequency. In one implementation, each of the clock divider circuits 430 and 434 has a ratio of two, thus producing a half-rate clock signal (i.e., trunk 432) and a quarter-rate clock signal (i.e., trunk 428). Clock signals for the first stage (i.e., clk4TI, clk4TIb, clk4TQ, and clk4TQb in FIG. 4) are provided from trunk 428 (i.e., quarter-rate clock signal).

A clock signal that drives the second stage 2:1 MUX circuit 410 is generated using a flip flop 436 (i.e., clock synchronizer) such as a D-type flip flop or a latch. The flip flop 436 receives a half-rate clock as its input and generates the clock signal for the second stage 2:1 MUX circuit 410. The flip flop 436 is clocked by a full-rate clock. The flip flop 436 in the clock path acts as a half-rate clock synchronizer. The systematic duty cycle error on half rate clocks is therefore removed. The impact of random mismatch from the flip flop 436 is suppressed by distributing the flip flops into each multiplexer circuit associated with consecutive bits of data: MSB1, . . . , LSB.

In one implementation, the flip flop 436 associated with each multiplexer circuit (i.e., 404a, 404b, . . . , 404n) can be consolidated to reduce power consumption. For example, the output clock from the flip flop 436 may be shared between two or three multiplexing circuits associated with two or three bits of data. Consolidating the flip flops can reduce full-rate clock loading. The number of flip flops that may be consolidated depends on a tradeoff between power consumption and degree of randomness. As discussed previously herein, the randomness minimizes the systematic duty cycle error.

The full-rate multiplexer circuit 400 described herein has no hard timing constraint. In addition, there are no flip-flops on the full-rate data path which may degrade the data. Thus, the circuit described herein has an improved speed and performance.

FIG. 6 is a schematic that shows a timing diagram 600 of various signals in the circuit 400 according to one example. The timing diagram 600 includes clock input 602, resulting half-rate clock signals clk2Tb 604 and clk2T 606 and resulting signals d1T_MSB1 608 and d1T_MSB2 610. At the rising edge of clock 602 may correspond to a rising edge of clock signal 606 (i.e., clock signal from trunk 432 in FIG. 4), a data transition occurs. Signal d1T_MSB1 608 is associated with multiplexer 502 and d1T_MSB2 610 is associated with multiplexer 504. Clock signal clk2Tb 604 is associated with input CLK of multiplexer 504 and input CLKb of multiplexer 502 as described in FIG. 5. Further, clock signal clk2T 606 is associated with input CLK of multiplexer 502 and input CLKb of multiplexer 504. Thus, the delay between clock signals may affect each data transition. Mismatch between clock delays is mixed together (i.e., skewed at every data transition instead of every other data transition) which in turn shift the corresponding tone from Fs/2±Fout to Fs±Fout.

In one implementation, the multiplexing circuit described herein may be used in a transceiver in an optical communication system.

Figure 7:
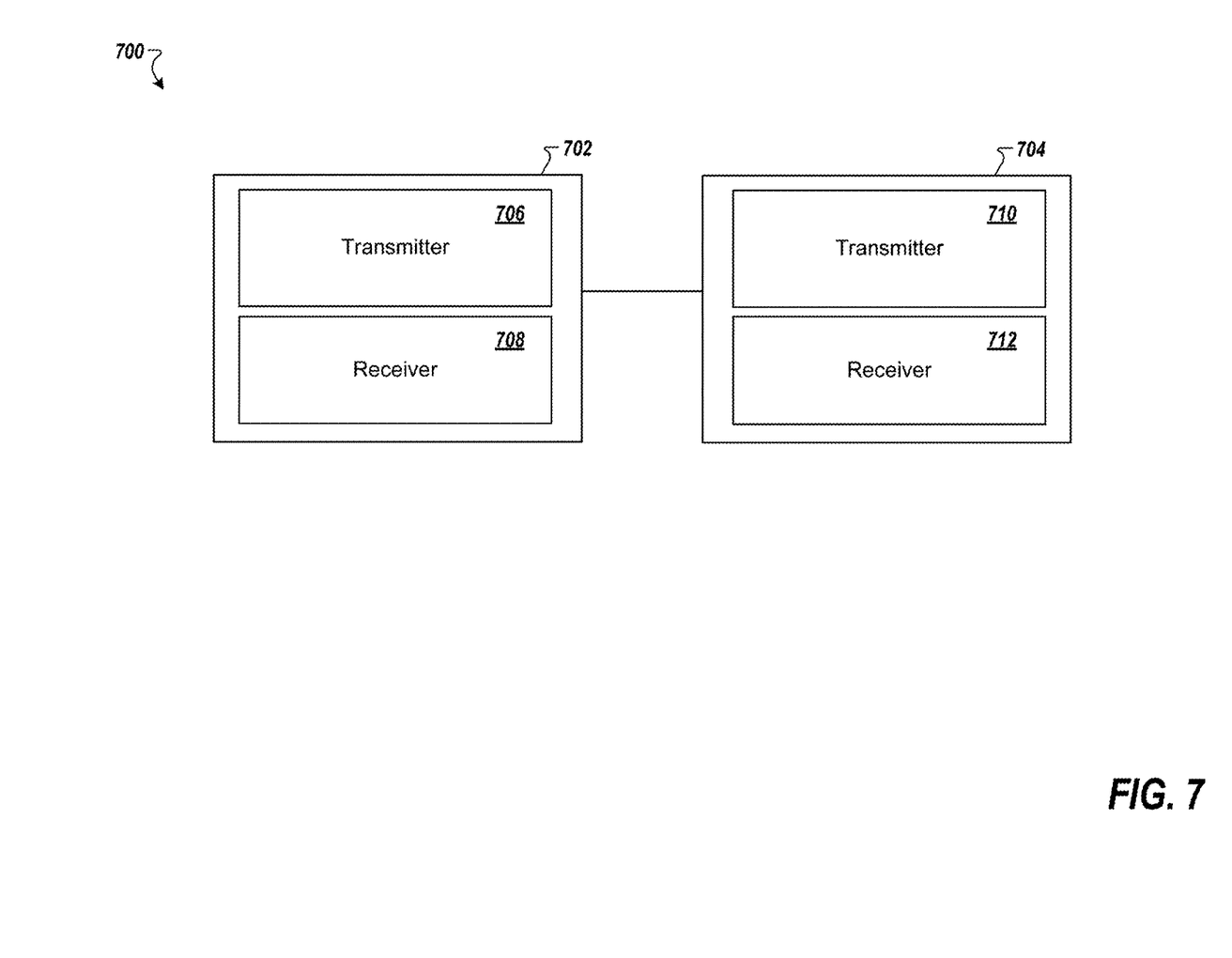
FIG. 7 is a block diagram of a communication system according to one embodiment.

FIG. 7 is a block diagram of a communication system 700 according to one embodiment. The communication system 700 may be a high speed optical communication system (e.g., 10 Gbps+). The communication system 700 may include transceivers 702 and 704 interconnected via a link such as a fiber. The transceiver 702 includes a transmitter 706 (e.g., a coherent transmitter) and a receiver 708. The transceiver 704 may include a transmitter 710 and a receiver 712. The transmitters 706 and 710 may include the MUX-DAC based transmitter described herein. The transceivers 702 and 704 may support one or more modulation formats such as binary phase shift keying (BPSK), quadrature phase shift keying (QPSK), 8-quadrature amplitude modulation (QAM), 16-QAM, and the like.

A system which includes the features in the foregoing description provides numerous advantages. In particular, the MUX-DAC based transmitter described herein can achieve high speed and high performance simultaneously.

Obviously, numerous modifications and variations are possible in light of the above teachings. It is therefore to be understood that within the scope of the appended claims, the invention may be practiced otherwise than as specifically described herein.

Thus, the foregoing discussion discloses and describes merely exemplary embodiments of the present invention. As will be understood by those skilled in the art, the present invention may be embodied in other specific forms without departing from the spirit or essential characteristics thereof. Accordingly, the disclosure of the present invention is intended to be illustrative, but not limiting of the scope of the invention, as well as other claims. The disclosure, including any readily discernible variants of the teachings herein, defines, in part, the scope of the foregoing claim terminology such that no inventive subject matter is dedicated to the public.

The invention claimed is:

1. A circuit, comprising:
a multiplexer circuit having symmetrical data input paths driven by a half-rate clock signal; and
a first stage multiplexing circuit configured to provide input signals to the multiplexer circuit, wherein
the first stage multiplexing circuit is driven by quadrature clocks to generate time-shifted data,
the circuit is configured to be one of a plurality of circuits that are associated with an input data bit and that each provide an input to a digital to analog converter,
the plurality of circuits includes a plurality of symmetrical multiplexers, and
every other symmetrical multiplexer of the plurality of symmetrical multiplexers is flipped.

2. The circuit of claim 1, further comprising:
a clock synchronizer configured to synchronize the half-rate clock signal, wherein
the clock synchronizer is driven by a full-rate clock signal.

3. The circuit of claim 1, further comprising:
a clock synchronizer configured to provide a drive signal to the multiplexer circuit.

4. The circuit of claim 3, wherein the clock synchronizer is a flip flop.

5. The circuit of claim 1, wherein the circuit is included in a transmitter.

6. The circuit of claim 1, wherein the first stage multiplexing circuit has eight data lines.

7. The circuit of claim 1, further comprising a second stage multiplexing circuit.

8. The circuit of claim 7, wherein
the first stage multiplexing circuit provides an eight to four multiplexing function, and
the second stage multiplexing circuit provides a four to two multiplexing function.

9. The circuit of claim 8, further comprising a third stage multiplexing circuit that provides a two to one multiplexing function.

10. The circuit of claim 7, wherein the first multiplexing circuit and the second multiplexing circuit are driven by a same clock signal.

11. A circuit, comprising:
a clock synchronizer driven by a full-rate clock signal, the clock synchronizer configured to
synchronize a half-rate clock signal, and
provide a drive signal to one or more multiplexers associated with a plurality of circuits each associated with an input data bit and each providing an input to a digital to analog converter, wherein
the one or more multiplexers have symmetrical data input paths, and
every other multiplexer of the one or more multiplexers is flipped.

12. The circuit of claim 11, wherein
the circuit is one of the plurality of circuits, and
each circuit of the plurality of circuits comprises:
- a multiplexer circuit having symmetrical data input paths driven by the synchronized half-rate clock signal; and
- a first stage multiplexing circuit configured to provide input signals to the multiplexer, the first stage multiplexing circuit being driven by quadrature clocks to generate time-shifted data.

13. The circuit of claim 12, further comprising a second stage multiplexing circuit.

14. The circuit of claim 13, wherein
the first stage multiplexing circuit provides an eight to four multiplexing function, and
the second stage multiplexing circuit provides a four to two multiplexing function.

15. The circuit of claim 14, further comprising a third stage multiplexing circuit that provides a two to one multiplexing function.

16. The circuit of claim 14, wherein the first multiplexing circuit and the second multiplexing circuit are driven by a same clock signal.

17. The circuit of claim 12, wherein
the every other multiplexer is configured to receive a complemented clock signal at a clock input and a clock signal at a complemented clock input, and
the every other multiplexer is configured to receive a data input associated with a second output of the first stage multiplexing circuits at a first input and data associated with a first output of the first stage multiplexing circuits at a second input of the every other multiplexer.

18. The circuit of claim 11, wherein the circuit is included in a transmitter.

19. A method for driving multiplexer circuits, comprising:
inputting a half-rate clock signal to one or more clock synchronizers;
clocking the one or more clock synchronizers with full-rate clock signals to synchronize the half-rate clock signal; and
driving one or more multiplexers with the synchronized half-rate clock signal, wherein
the one or more multiplexers have symmetrical data input paths, and
every other multiplexer of the one or more multiplexers is flipped.

20. The method of claim 19, further comprising:
providing a complemented synchronized half-rate clock signal at a clock input to every other multiplexer;
providing the synchronized half-rate clock signal at a complemented clock input to the every other multiplexer;
providing data input associated with a second output of a first stage multiplexing circuits at a first input of the every other multiplexer; and
providing data input associated with a first output of the first stage multiplexing circuits at a second input of the every other multiplexer.

* * * * *